US 6,332,928 B2

(12) United States Patent
Shealy et al.

(10) Patent No.: US 6,332,928 B2
(45) Date of Patent: *Dec. 25, 2001

(54) HIGH THROUGHPUT OMPVE APPARATUS

(75) Inventors: J. Richard Shealy; Barry P. Butterfield, both of Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/740,890

(22) Filed: Dec. 21, 2000

Related U.S. Application Data

(63) Continuation of application No. 09/115,520, filed on Jul. 15, 1998, now Pat. No. 6,217,937.

(51) Int. Cl.[7] .................................................... C23C 16/00
(52) U.S. Cl. .................... 118/725; 118/708; 118/715; 118/730; 118/724
(58) Field of Search ................................. 118/708, 712, 118/715, 725, 730, 724

(56) References Cited

U.S. PATENT DOCUMENTS

| | | |
|---|---|---|
| 3,177,100 | 4/1965 | Mayer et al. . |
| 3,243,323 | 3/1966 | Corrigan et al. . |
| 3,705,091 | 12/1972 | Jacob . |
| 4,362,632 | 12/1982 | Jacob . |
| 4,369,031 | 1/1983 | Goldman et al. . |
| 4,565,157 | 1/1986 | Brors et al. . |
| 4,579,080 | 4/1986 | Martin et al. . |
| 4,760,244 | 7/1988 | Hokynar . |
| 4,794,220 | 12/1988 | Sekiya . |
| 4,878,989 | 11/1989 | Purdes . |
| 4,950,621 | 8/1990 | Irvine et al. . |
| 4,976,216 | 12/1990 | Maeda . |
| 4,979,466 | 12/1990 | Nishitani et al. . |
| 4,980,204 | 12/1990 | Fujii et al. . |
| 4,989,540 | 2/1991 | Fuse et al. . |
| 5,015,327 | 5/1991 | Taguchi et al. . |
| 5,119,761 | 6/1992 | Nakata . |
| 5,160,542 | 11/1992 | Mihira et al. . |
| 5,164,040 | 11/1992 | Eres et al. . |
| 5,234,527 | 8/1993 | Nozawa et al. . |
| 5,250,137 | 10/1993 | Arami et al. . |
| 5,308,955 | 5/1994 | Watanabe . |
| 5,318,633 | 6/1994 | Yamamoto et al. . |
| 5,346,581 | 9/1994 | Tsang . |
| 5,415,126 | 5/1995 | Loboda et al. . |
| 5,415,128 | 5/1995 | Kao et al. . |
| 5,421,892 | 6/1995 | Miyagi . |
| 5,453,124 | 9/1995 | Moslehi . |
| 5,458,689 | 10/1995 | Saito . |
| 5,478,429 | 12/1995 | Komino et al. . |
| 5,496,806 | 3/1996 | Klemke . |
| 5,511,608 | 4/1996 | Boyd . |
| 5,575,853 | 11/1996 | Arami et al. . |
| 5,704,981 | 1/1998 | Kawakami et al. . |
| 5,749,974 | 5/1998 | Habuka et al. . |
| 5,769,950 | 6/1998 | Takasu et al. . |
| 5,833,754 | 11/1998 | Ito et al. . |

Primary Examiner—Richard Bueker
(74) Attorney, Agent, or Firm—Jones, Tullar & Cooper, P.C.

(57) ABSTRACT

A cold wall reactor having inner and outer walls defining an annular reactor cell. A susceptor is rotatably mounted in the cell, and received wafers to be treated by gases flowing axially through the cell. The outer wall of the reactor is normally cooled, but is heated by a suitable furnace to provide a hot wall reactor when cleaning of the cell is required.

17 Claims, 3 Drawing Sheets

HIGH THROUGHPUT OMPVE APPARATUS

This application is a continuation of U.S. application Ser. No. 09/115,520, filed on Jul. 15, 1998, and entitled "High Throughput OMPVE Apparatus", now U.S. Pat. No. 6,217, 937.

BACKGROUND OF THE INVENTION

The present invention relates, in general, to apparatus for producing flow modulation epitaxy, and more particularly relates to a high throughput organometallic vapor phase epitaxy (OMVPE) apparatus for deposition of material on substrates. In a preferred embodiment, the invention is directed to a cold wall reactor, which is convertible to a hot wall reactor, for epitaxial deposition of compound semiconductor materials.

Reactors for use in chemical vapor deposition, for example for epitaxial processing of semiconductor materials, or wafers, are generally well known. Two types of reactor are available for epitaxial processing, one being referred to as a cold wall reactor and the other being referred to as a hot wall reactor. Both types are well known, and the particular reactor used depends upon the type of reaction to be performed. For example, silicon processing is normally done in a hot wall reactor device.

In a chemical vapor deposition reactor, the chemicals used in the process have a tendency to decompose on the cell wall as well as on the substrate as they flow through the cell. Layers of decomposed reactants build on the cell wall, and eventually these layers begin to flake off, producing particulate contaminates in the cell which damage the wafer being processed. In addition, certain compounds produce a chemical memory effect; i.e., impurities accumulate on the cell wall, and then are released during a later run, contaminating that later run. To prevent such contamination, the cells must be periodically cleaned. Usually, however, this can only be done by disassembling the device, which not only is time-consuming, but causes the entire cell to become contaminated by the atmosphere. Thus, there is a need for a mechanism for cleaning reactor cells without the need to disassemble them and without risking contamination.

Furthermore, in many chemical vapor deposition reactors a cooling mechanism is provided to reduce the temperature of the hot reactive gases after they have passed over the wafer to be treated and prior to their removal from the reactor by external vacuum equipment. In such devices, however, as the cooled gases flow out of the chamber, the chemicals carried by the gases condense or precipitate onto the vacuum equipment, requiring time consuming and expensive maintenance to avoid serious damage to the equipment. When phosphide compounds are used in reactors of this type, for example in the formation of red lasers, such compounds present an additional problem, for yellow, red or white phosphorous compounds are pyrophoric and spontaneously catch fire if exposed to the atmosphere. If such products precipitate onto the reactor walls or reach the vacuum equipment, opening the reactor to clean it can result in a fire.

Finally, difficulties have been encountered in the gas distribution systems used with various cell geometries, for it is difficult to obtain a proper seal for the reactor chamber, thereby limiting the structural arrangement of the reactor and the consequent flow paths. As a result, many reactor arrangements cause the gases to be directed onto flat surfaces. The gases rebound from such surfaces, resulting in a highly undesirable recirculation of the reactive gases within the chamber. Thus, a simplified reactor geometry having improved fluid dynamics for the gas flowing into the chamber that will avoid recirculation problems is highly desirable.

SUMMARY OF THE INVENTION

The present invention resolves the problems of prior reactor devices as discussed above. Accordingly, the invention provides, among other things, a vertical barrel, concentric cylinder design for a cold wall reactor cell which can be converted to a hot wall cell for cleaning the interior of the reactor.

In accordance with the invention, the reactor includes inner and outer concentric cylinders which preferably are quartz tubes, which cooperate to define an annular reactor cell. A susceptor is mounted in the annular reactor cell, adjacent the exterior surface of the inner cylinder, and includes an outwardly sloping, or conical, outer surface which receives wafers to be treated. The susceptor is supported in the cell by a rotation fixture which includes a support cylinder, which may be another quartz tube, having an upper edge which engages the bottom of the susceptor and having a lower edge supported on a support bearing carried by a lower end cap for the reactor cell. The rotation fixture also includes a gear wheel mounted on the exterior of the support cylinder and driven by a corresponding drive gear mounted on the shaft of a drive motor.

A lift fixture includes a top end cap supporting a lift cylinder, which preferably is a quartz tube surrounding the inner reactor cell cylinder. The lift cylinder has a lower shoulder which engages the susceptor and an upper shoulder which engages the end cap. When the lift fixture is moved upwardly, the susceptor is pulled through the top end of the outer reactor cylinder to provide access to wafers on the susceptor and to allow them to be inspected, adjusted and/or replaced. The lift cylinder is rotatable with respect to the top closure so the susceptor may be rotated when lifted for access to all the wafers on the susceptor.

The outer reactor cell cylinder surrounds and encloses the inner reactor cylinder, the susceptor, and the upper lift cylinder, and is secured at its upper end to the top end cap and at its lower end to a bottom end cap. Both end caps preferably are stainless steel, with appropriate seals between the cylinder and the stainless steel end caps being provided. The inner reactor cell cylinder is closed at its top end, and extends downwardly through, and is sealed to, the lower end cap so that the interior of this tube is exposed to atmosphere while the annular region between the cylinders is sealed from ambient atmosphere. An induction heating coil, quartz lamps, or other suitable heat source extends into the inner reactor cylinder to heat the susceptor and thus the wafers which the susceptor supports. The sealed annular region between the inner and reactor cylinders functions as a closed reaction cell.

Hot reaction gases are introduced into the reaction cell at its top end, one or more outlet pumping ports with included filter assemblies are located below the outer reactor cell cylinder, preferably in the lower end cap, for drawing the gases downwardly over the outer surface of the susceptor and the wafers mounted thereon for delivering unused reaction gases to an external vacuum source. Between the susceptor and the outlet port, and surrounding the rotation fixture, is an annular cooler which serves to cool the process gases prior to their exiting the cell. This condenses the majority of unused reactants into their solid phases for trapping by the filters in the outlet ports to prevent the exhaust gas plumbing and valves from being coated with film during reactor operation. Additional cooling is provided by a split clamshell cooling jacket which surrounds the reactor cell cylinder.

The upper and lower end caps preferably are surrounded by conventional dry box enclosures which contain an inert gas and which thereby enable the upper and lower caps to be opened for access to the susceptor and access to and cleaning of the outlet port filters without contaminating the interior of the cell and without the risk of fire or smoke from pyrophoric deposits.

The heat source used with the present invention preferably is a heating coil which is excited by a radio frequency (RF) generator, with the RF power being coupled to the graphite susceptor which forms an inductive load for the coil. The susceptor is thereby heated directly, while the surrounding outer reactor cylinder is heated indirectly, by radiation from the hot graphite, by conduction through the gas present in the cell, or through the supporting rotation fixture, rather than inductively. The reaction chamber is said to be a cold wall cell because of this method of heating. An alternative radiant heating method for cold wall operation is the use of an array of quartz lamps located inside the rotation fixture in place of the heating coil.

To turn the cold wall cell into a hot wall cell for a "self cleaning" operation, the cooling jacket is removed and a split clamshell furnace is provided around the outside of the outer reactor cylinder. During cell cleaning, the wall of the outer cylinder is heated and a corrosive gas such as HCl or a corrosive plasma is injected into the reactor cell to etch deposits off the cell wall and the susceptor. Heating the wall also produces a heating mismatch which will cause deposits to crack and flake off the wall. Using this approach, the cell can be cleaned periodically so that the deposits do not build up and contaminate the cell with particulate matter or with previously used reactants, and this allows cleaning to be done without disassembly or exposure to the atmosphere, thereby preventing atmospheric contamination of the cell.

The present invention is also directed to a reactor gas injection structure which is usable with a variety of reactor cells, but which is particularly adapted to use with the reactor of the present invention to allow the cell to operate in a variety of different modes. Injection ports are located at the top of the cell, adjacent the top end cap, and permit injection of reactant gases through selected ports located symmetrically around the exterior of the reaction cell. Selected gases or gas mixtures can be injected through single selected ports, or through several ports for dispersal around the entire cell. The injection ports preferably are located symmetrically around the cell, with four ports defining four growth zones, for example, and additional ports being provided to permit a uniform distribution of gases in the reactor. The localization of a reactant gas in each zone is provided by establishing a vertical laminar flow in the reaction cell and by ensuring that the lateral diffusion of vapor species is small compared to the cell dimension as the gas traverses the cell from top to bottom. This laminar flow is enhanced by placing corresponding filtered exit ports at the bottom of the cell. The exit ports may be vertically aligned with the injection ports and can include flow controllers if desired.

In accordance with the present invention, the gas injection portion of the device includes a set of input mass flow controllers (MFCs) connected to supply to a distributor block a carrier gas and one or more desired reactant gases which are to be delivered to the reactor cell. An MFC is connected to a pressure transducer which adjusts the flow of carrier gas to maintain a constant pressure in the distributor block. The gas mixture exits the distributor block through one or more selected MFCs of a set of matched MFC devices which are connected between the distributor block and corresponding injection ports leading to the reaction cell. In this way, controlled quantities of the selected reaction gases enter each injection port.

In addition to the spaced growth zone injector ports, additional intermediate injectors may be provided for use in cases where a diffused flow of reactant gas is desired. Such injectors may be spaced to yield a nearly uniform concentration of gases around the cell.

In the preferred form of the invention, the susceptor is rotatable to carry each wafer in turn through the growth zones, exposing the wafers to doses of the selected constituents in the desired sequence to produce flow modulation epitaxy of the wafers.

The annular flow cell of the present invention improves the fluid dynamics of the gas flowing into and through the cell. The annular cell has a longitudinal, or axial, vertical flow which prevents recirculation within the cell by causing the gas to flow downwardly from the inlet ports across the surfaces of the wafers, to the outlet ports. It will be understood that the flow direction could be reversed, to cause the gas to move upwardly across the wafers. Further, a variety of substrates may be treated in the reactor cell of the invention, but the specific substrates and specific reaction processes are not a part of the present invention.

BRIEF DESCRIPTION OF THE DRAWINGS

The foregoing, and additional objects features and advantages of the present invention will be apparent to those of skill in the art from the following detailed description of a preferred embodiment thereof, taken in conjunction with the accompanying drawings, in which.

DESCRIPTION OF PREFERRED EMBODIMENTS

Figure 1:
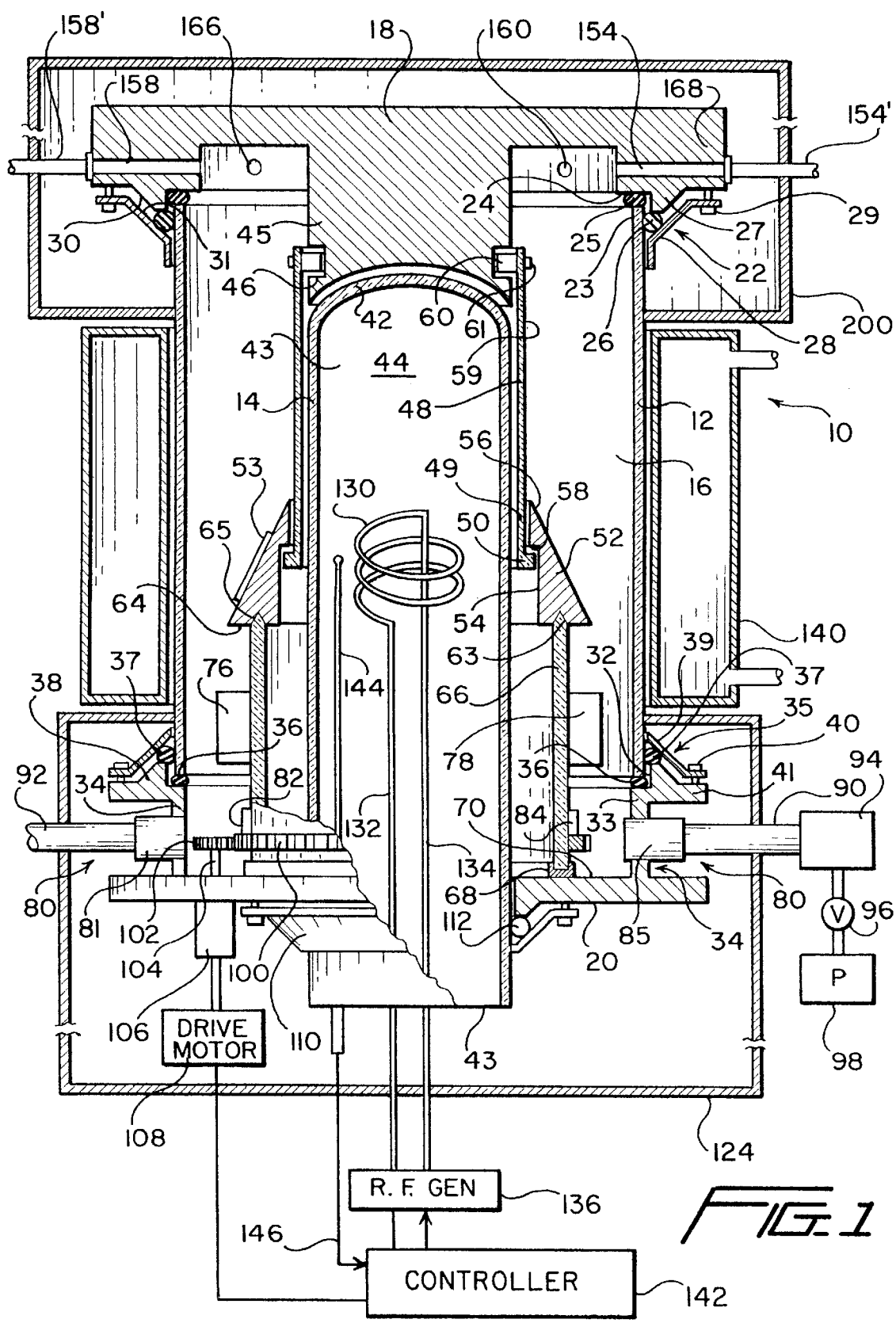
FIG. 1 is a side elevation view in partial cross section of a vertical barrel organometallic vapor phase epitaxy apparatus in accordance with the present invention.

Turning now to a more detailed description of the present invention, there is illustrated at 10 in FIG. 1 a vertical barrel, concentric cylinder, organometallic vapor phase epitaxy (OMVPE) apparatus which includes an annular reaction cell for high throughput epitaxial deposition of compound semiconductor materials and for other reaction processes. The OMVPE apparatus 10 is of the cold wall type, and includes a generally cylindrical outer wall 12 and a coaxial, generally cylindrical inner wall 14. The outer and inner walls are spaced apart to provide an annular flow-through reaction cell, or chamber, 16.

The outer cylindrical wall 12 may be formed of a cylindrical tube which may be approximately 10 inches in diameter in one embodiment of the invention. The tube is closed at its top end by a stainless steel, water cooled top end cap 18 and at its lower end by a stainless steel, water cooled bottom end cap 20. The tube 12 is preferably quartz, although other materials may be used for this outer wall, depending on process parameters such as deposition temperature and the purity of the material being used. A quartz-to-metal seal 22 is formed at the junction of an upper edge 23 of the outer wall 12 and a lower surface 24 of the end cap 18. The seal 22 may include first and second O-rings 25 and 26 of Viton, silicon rubber, or a suitable commercially available elastomer material such as Kalrez. Ring 25 is located between edge 23 and surface 24, while ring 26 is secured against the outer surface of tube 12 by a clamp which includes an annular shoulder 27 formed on the bottom surface 24 of cap 18 and an annular movable clamping jaw 28 which is secured to cap 18 by a series of spaced bolts 29. The shoulder 27 includes an outwardly sloped outer surface 30 which is parallel to an outwardly sloped inner surface 31 of clamping jaw 28, with O-ring 26 being captured between the shoulder 27 and the surface 31 of jaw 28. By tightening the bolts 29, the O-ring is squeezed against the outer surface of cylinder 12 to hermetically seal the junction of cylinder 12 with cap 18.

In similar manner, bottom edge 32 of wall 12 is sealed to a top edge 33 of an upstanding stainless steel cylindrical flange 34 which forms a part of the bottom end cap 20, as by means of a quartz-to-metal seal 35. This quartz-to-metal seal preferably is of the same construction as the seal 22, including an O-ring 36 between the end of cylinder 12 and the top of flange 34, and an O-ring 37 captured between a shoulder 38 on flange 34 and a movable clamping jaw 39 secured by bolts 40 to an outwardly extending tip 41 on flange 34.

The inner concentric wall 14 preferably is a quartz tube having a diameter of about 8 inches, for example, which is closed at its upper end by a dome-shaped integral end wall 42. The open lower end 43 of the tube 14 protrudes downwardly through the end cap 20 so that the interior 44 of the tube is exposed to the ambient atmosphere. In the preferred form of the invention, the top end 42 of tube 14 engages a downwardly-extending filler/bearing support portion 45 integral with end cap 18. The end cap and filler portion are water cooled, and are preferably of stainless steel. The filler portion 45 is generally cylindrical, and of approximately the same diameter as the inner cylinder 14 to fill the upper end of the annular reactor cell so as to reduce gas flow turbulence.

The filler 45 carries a bearing groove 46 to support and to facilitate rotation of a cylindrical lift tube 48, which surrounds the upper part of inner cylinder 14. The lift tube extends approximately one-half the distance down the axial length of the wall of inner cylinder 14 and terminates at a lower end 49, which incorporates an outwardly extending flange 50. Surrounding the lift tube 48 and its flange 50 and extending downwardly therefrom is an annular susceptor 52 for receiving wafers 53 or other materials to be treated in reactor cell 16. The susceptor preferably is formed of graphite, although other materials such as refractory metals are feasible in some applications, and includes a cylindrical interior wall 54 which is coaxial with the lift tube 48 and spaced outwardly therefrom to permit rotation of the susceptor with respect to the tube 48. Materials to be treated are mounted on a downwardly and outwardly tapered outer wall 56 of the susceptor which is spaced inwardly from the outer cylinder 12 and thus lies in the path of gases flowing through the reaction chamber 16. The interior surface 54 of susceptor 52 includes an inwardly extending shoulder 58 having a lower annular surface which engages the flange 50 of tube 48 when the lift tube 48 is moved upwardly, so that the susceptor will be lifted.

The top end 59 of the lift tube 48 is secured to an annular lift bearing 60, or to multiple bearing segments spaced around end 59, as by bolts 61 extending through apertures in the quartz lift tube. The lift bearing extends inwardly into the bearing groove 46 so that when the top end cap 18 is removed from the reactor cell, the bearing groove 46 will engage lift bearing 60 to raise the lift tube 48. This will cause the flange 50 to engage shoulder 58 so that the susceptor 52 will be raised by the upward movement of the lift tube. Accordingly, tube 48 can be used to lift the susceptor 52 out of the reactor chamber, with the bearing surfaces allowing the susceptor to be rotated for easy access to all the wafers on surface 56.

The susceptor 52 has a groove 63 formed in its bottom surface 64. This allows the susceptor to be positioned in the reaction chamber by lowering the lift tube so that groove 63 rests on a corresponding ridge 65 formed on the top edge of a support cylinder 66. The cylinder 66 preferably is a quartz tube which rests on a support bearing 68 secured to the top surface 70 of the end cap 20. The support bearing 68 positions tube 66 so it is coaxial with inner tube 14 and allows tube 66 to rotate with respect to end cap 20. The ridge 65 on the top of support tube 66 centers the susceptor with respect to the axis of tube 14 and lifts the susceptor off the lift tube flange 50 as the top end cap 18 is lowered into place to close the top of the reaction cell 16. This frees the susceptor to rotate with support tube 66.

A gas cooler such as a stainless steel can 76 surrounds the tube 66 and has an outer wall 78 lying in the path of gases flowing through the reaction chamber 16. The interior of can 76 may contain water or $LN_2$ for cooling purposes, for example.

Located below the cooling can 76, and spaced around the upstanding flange 34 are a plurality of exhaust filters and pump assemblies generally indicated at 80 and including a plurality of exit ports illustrated at 81 to 88. Preferably four or eight exit ports are equally spaced around the circumference of flange 34 and are connected by way of outlet conduits such as those illustrated at 90 and 92 to a manifold 94 which is, in turn, connected through a valve 96 to a vacuum pump 98. Each of the exit ports includes a filter (not shown) preferably carried on a support screen and constructed from non-reactive material such as Teflon, for example.

A ring gear 100 is secured to the exterior of quartz support tube 66 for rotation therewith. The ring gear is driven by a drive gear 102 mounted on a drive shaft 104 which passes through the bottom end cap 20 by way of a feedthrough 106 to a drive motor 108. The feedthrough may be an ultra high vacuum bellows or a ferrofluidic drive, allowing the drive motor 108 to rotate the tube 66. The ratio between gears 100 and 102 will depend upon the speed of the drive motor, and on the size and the desired speed of rotation of the support tube.

In the illustrated embodiment, the inner quartz tube 14, which extends downwardly through the bottom end cap 20, is hermetically sealed by a circumferential seal 110, including an O-ring 112, to the end cap. The seal 110 arrangement is similar to the seal 22 described above. The quartz tube 14 provides a continuous inner wall for the annular reactor cell 16, and surrounds the interior cavity 44 which forms a central, or axial inner chamber opening downwardly through the open bottom 43 to the ambient atmosphere. In this case, the ambient atmosphere is provided by an inert gas contained in a dry box 124 which surrounds the lower portion of the reactor cell, and particularly the lower end cap portion below seal 36, to permit the lower end of the reaction chamber 16 to be opened by lowering end cap 20. This provides access to the filters in the exhaust filter assembly 80 without contaminating the reaction chamber.

An RF coil 130 is mounted in the inner chamber portion 44, and is located near the inner wall 54 of the susceptor 52. The coil preferably is made from copper tubing and is connected by way of leads 132 and 134 extending through the quartz tube 14 to an RF generator 136 which may be located outside the dry box 124. The coil 130 inductively heats the graphite susceptor, with its location ensuring that only the susceptor is directly heated. The surrounding quartz tubes, and in particular the tubes 12, 14, 48 and 66 are not directly heated, but are indirectly heated by radiation from the hot susceptor material, by conduction through gas present in the reaction cell 16, or by conduction to the supporting quartz tube 66. The reaction chamber 16 is said to be a cold wall cell because of this method of heating.

In a prototype of the apparatus 10, the RF generator was operated at 85 kHz, and up to 11 kW was delivered to the coil. It was found that about 7 kW was sufficient to heat the susceptor to temperatures exceeding 1000° C. An alternative heating method for cold wall operation is available through the use of an array of quartz lamps placed inside the susceptor in the location of the coil 130. If desired, the heating coil could be placed outside the outer tube 12, but that is not the preferred arrangement.

Surrounding the outer quartz tube 12 is a water jacket 140 which provides a flow of cooling fluid to the outer wall 12 during operation of the reactor. This jacket preferably is of a split clamshell design so that it is removable to convert the reactor cell to a hot wall device for cleaning, as will be described.

A suitable controller 142 may be provided to operate the drive motor 108 and to regulate the RF generator 136 in response to the temperature of the susceptor, as detected by a thermocouple probe 144 connected to the controller by way of a line 146.

Figure 2:
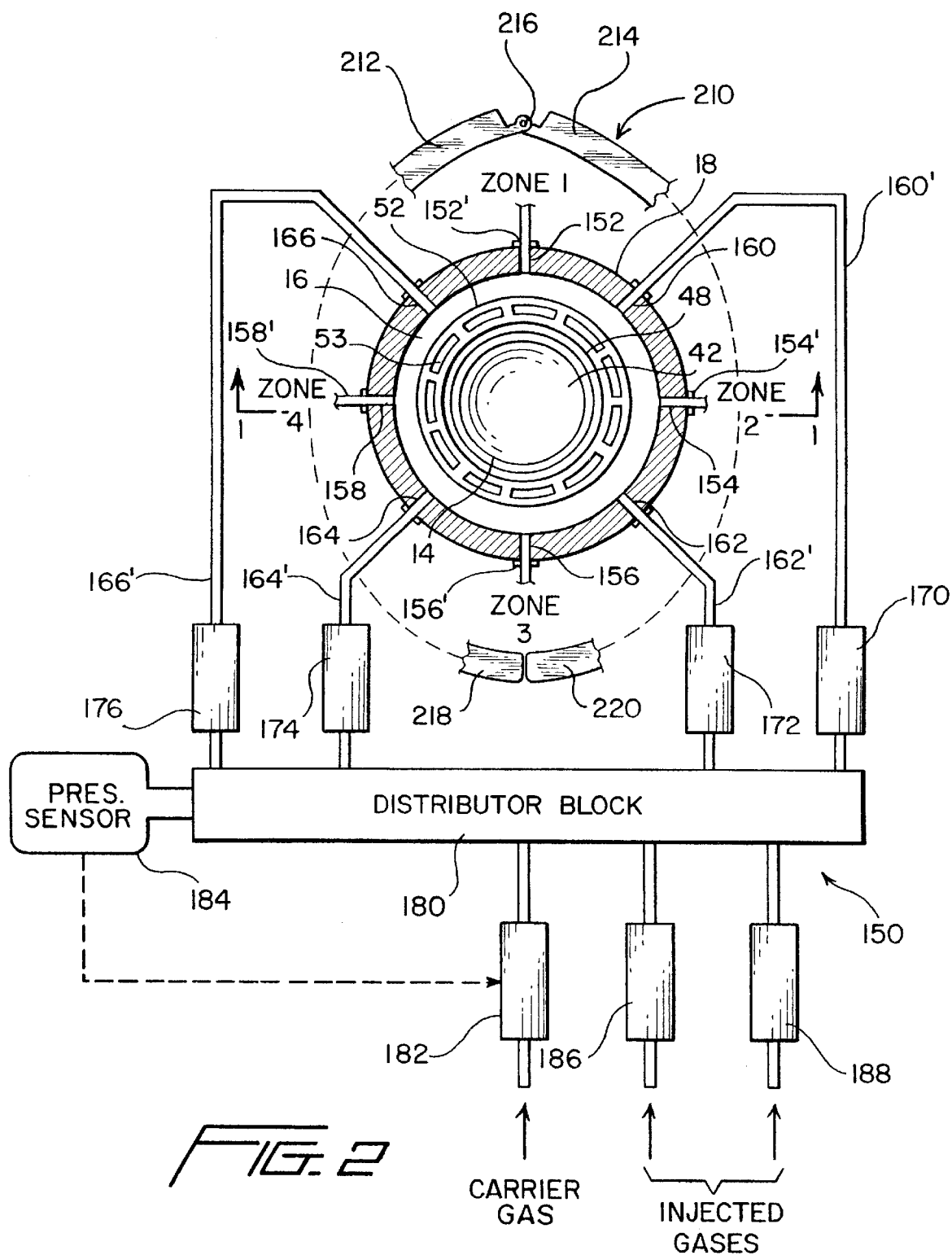
FIG. 2 is a top view of the apparatus of FIG. 1, with the top cover of the reactor removed, and illustrating a gas injection arrangement for the reactor.

Reactant gases are supplied to the reactor chamber 16 from a gas delivery system 150 illustrated in greater detail in FIG. 2, to which reference is now made. The illustrated gas delivery system allows the reaction cell to operate in a variety of different modes. For example, reactant gases can be injected with selected vapor species locally confined to one or more of four separate injection ports 152, 154, 156 and 158, and labeled as zones 1–4. Each port may provide an injection pattern covering a controlled arc, so that the gases from adjacent ports overlap by a few degrees during operation. Alternatively, gases can be injected as a single gas mixture dispersed around the entire cell through four or more injection points such as 160, 162, 164 and 166, or a combination of all of the ports can be used. As illustrated, the latter injection points are located symmetrically between the four zone injection points, with all of the injection points being equally spaced around the circumference of the reaction chamber 16.

FIG. 2 is a top view of the apparatus of FIG. 1, with the top end cap 18 sectioned and the filler 45 removed. As illustrated, the injection ports extend through a downwardly extending annular flange portion 168 of end cap 18 to inject reactant gases into the reaction chamber 16. The injectors 152, 154, 156 and 158 may be connected through corresponding inlet conduits 152', 154', 156' and 158', respectively, to corresponding sources of carrier or reactant gases each of which may carry a selected vapor species for epitaxial deposition on wafers 53, which may be compound semiconductor materials, for example.

In similar manner, the injection ports 160, 162, 164 and 166 are connected by way of corresponding conduits 160', 162', 164' and 166' to corresponding sources of reactant or carrier gases, which in this case are illustrated as including input mass flow controllers (MFCs) 170, 172, 174, and 176. The MFCs are connected to a common distributor block 180, which may be a high purity stainless steel vessel and which may contain a carrier gas and desired reactant gases which are to be distributed around the reaction cell 16. In one embodiment of the invention, the carrier gas was $H_2$, while the reactant gases were HCl for cell cleaning, and were hydrides containing group V components for epitaxial deposition on a compound semiconductor. For example, $ASH_3$ can be deposited for gallium arsenide semiconductors, $NH_3$ can be deposited for GaN semiconductors, and InP can be used with a $PH_3$ gas.

The carrier gas is supplied to the distributor block through MFC 182 which is slaved to a pressure sensor 184 connected to the distributor block. The pressure transducer produces a carrier gas flow adjustment to maintain a constant pressure in the distributor block. Reactant gases are supplied to the distributor block through MFCs 186 and 188 and are mixed with the carrier gas in the block 180. The gas mixture exits the distributor block through MFCs 170, 172, 174, 176 and are injected into the reaction chamber 16. Equal quantities of the distributed gases enter each injection port between zones 1 to 4 and are diffused around the reaction cell 16, yielding a nearly uniform concentration of distributed gases around the cell. The number of injection points can be increased or decreased, as desired, to obtain the desired uniformity or nonuniformity of vapor concentration.

The gas injection ports located at the top of the reaction chamber, and in particular the four zone injection ports, preferably are vertically aligned with corresponding outlet ports at the bottom of the chamber to ensure a vertical laminar flow of gases from the top to the bottom of the chamber, thus avoiding uncontrollable swirling of gases about the vertical axis of the cell. This vertical laminar flow ensures that the vapor species injected at zones 1 to 4 will have only a small lateral diffusion compared to the cell dimension as the gas traverses the cell from top to bottom. In one embodiment of the reactor operating at a pressure of 25 torr with carrier gas flows of roughly 25 SLPM, this condition was easily met. It was found that by the time the vapor species reached the susceptor, they had spread roughly 120° around the cell, providing adjacent growth zones which overlapped only slightly.

Figure 3:
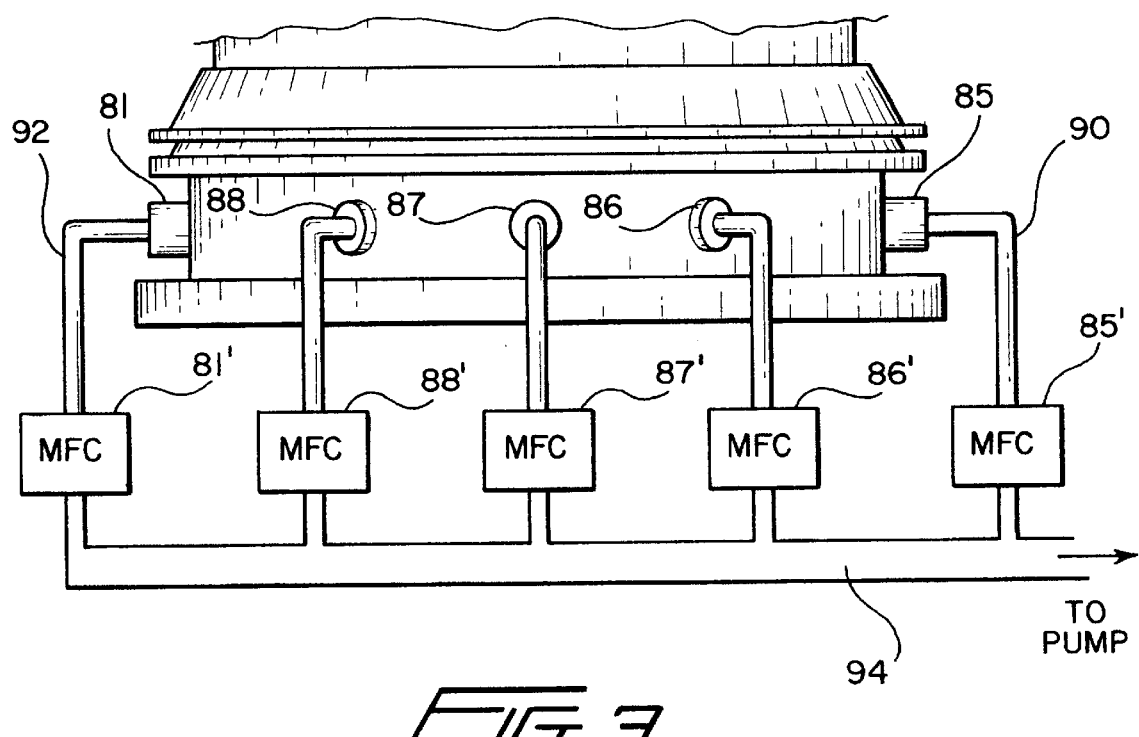
FIG. 3 is a side elevation view of the reactor outlet.

To ensure an equalized laminar flow in the reactor chamber 16, the outlet ports 81–88 are connected to manifold 94 through corresponding MFCs, five of which are illustrated in FIG. 3 at 81' and 85' through 88'. These controllers provide equal exit pumping at each port, and facilitate control of gas flow in the reactor cell.

Access to wafers 53 is obtained by removing the top end cap 18 and lifting the quartz lift tube 48. The flange 50 at the bottom of tube 48 engages the shoulder 58 in the susceptor 52, enabling the tube 48 to pull the susceptor upwardly and out of the top of the reaction chamber. A dry box enclosure 200 surrounds the top end of the reactor to provide a controlled ambient atmosphere to prevent contamination of the reactor during wafer loading and unloading.

In operation, the support tube 66 is rotated to move the susceptor 52 and thus the wafers 53 sequentially through the four growth zones provided by the vapor species injected at ports 152, 154, 156 and 158 and flowing vertically down through the reaction chamber. The surfaces of the substrate wafers are exposed to the selected constituent vapors in sequence, to provide flow modulation epitaxy on the wafers.

Flowing water or liquid nitrogen is supplied to the cooling can 76 to cool the process gases as they leave the reaction chamber. This condenses unused reactants into their solid phases for subsequent trapping by the filters in the outlet ports 81–88 to prevent the exhaust gas plumbing and valves from being coated with solid films during reactor operation. As noted above, the filters can be maintained by lowering the bottom end cap 20 into the dry box 124.

Some condensation can occur on the quartz outer wall 12 as well as on other parts of the chamber during a reaction process, and it therefore becomes necessary to clean the chamber periodically. This is accomplished, in accordance with the present invention, by converting the cold-wall reaction chamber into a hot wall chamber for a self-cleaning operation. During the cell cleaning step, a corrosive gas, such as HCL, is injected into the reaction cell and serves to etch deposits off the chamber walls and the susceptor. This preferably is done periodically so that the deposits do not build up and do not contaminate the cell with particulate matter or with previously used reactants.

Conversion of the reactor to a hot wall chamber device is accomplished by removing the cooling jacket 140 from the chamber and replacing it with a split clamshell furnace, diagrammatically illustrated at 210 in FIG. 2. This furnace may include a pair of arcuate sections 210 and 214 hinged at one end at 216 and abutting at their opposite ends 218 and 220. The arcuate segments curve around the outer wall 12 to enclose the reactor chamber and to heat it to a suitable temperature. Although the clam shell furnace 210 is illustrated for convenience as being spaced away from the outer wall 12, it will be understood that in fact the furnace interior wall may engage or be closely spaced from the outer wall 12 for maximum heat transfer. This clamshell furnace arrangement allows the reactor to be cleaned without disassembly and consequent contamination.

In summary, then, hot reactive gases enter the annular reaction chamber 16 at the top of the chamber and flow downwardly across substrates or wafers to be treated. These wafers are located on the downwardly and outwardly sloping outer wall of a graphite susceptor which is heated by an internal coil which, in turn, heats the wafers which are to be treated by the reactant gases. These gases flow vertically through the chamber and are removed through outlet filter ports by suitable external vacuum pumps. As the gases flow downwardly and out of the chamber, they are cooled by a cooling can to force the chemicals carried by the gases to precipitate before they reach the pump outlet port. This allows the filter assembly at the outlet ports to remove the particulates before they reach the vacuum pump and valve arrangement. The outlet ports are located in a dry box which is filled with an inert gas which not only prevents contamination of the reaction chamber when the filters are cleaned, but prevents fires in those cases when the compounds used are pyrophoric.

The cell geometry provides an improved gas distribution system, providing an extremely simple construction which has not previously been possible because of difficulties in obtaining seals for the reaction chamber. The herein-disclosed structure is capable of sustaining ultra high vacuum pressures approaching $10^{-8}$ torr with an appropriate pumping system. The cell is not operated under ultra-high vacuum (UHV) conditions, but leaks are diagnosed under such conditions. The annular shape of the flow cell improves the fluid dynamics of the gas flowing into and through the chamber, with the sloped surfaces of the wafers preventing gas rebound and eliminating undesirable recirculation of the gases. The downward flow of the gases from inlets in the top cap reduces the amount of dead air in the chamber and the cylindrical inner wall 14 together with the distributed gas injectors provides an improved operation.

The illustrated vertical chamber structure is preferred; however, it will be understood that a horizontal chamber device can be constructed utilizing the features illustrated herein. Additionally, the vertical flow chamber can be inverted, so that the reactant gases are introduced at the bottom of the reaction chamber, flow upwardly across the wafers on the substrate, and exit at the top of the chamber. This flow direction has some advantages, since the flow is in the same direction as the convection forces, but it requires the susceptor to be turned over. This, in turn, requires that the wafers be secured to the susceptor surface, and this is a major problem.

Although the reaction chamber is described as being formed by concentric quartz tubes, it is apparent that other materials can be used. For example, pyrolytic Boron Nitride would be an excellent material, and stainless steel could be used for low temperature processes. The susceptor is described as being graphite, but it could be any electrically conductive material, when RF inductive heating is used. Other thermally conductive materials such as Aluminum Nitride can be used with other heating sources. Various other materials will be apparent to those of skill in the art.

Although the invention has been described in terms of a preferred embodiment, it will be understood that numerous variations and modifications may be made without departing from the true spirit and scope thereof, as set forth in the following claims.

What is claimed is:

1. A high throughput reactor, comprising:
   a generally cylindrical outer reactor wall having a top end and a bottom end;
   a top end cap closing the top end of said outer wall, and a bottom end cap closing said outer wall;
   an inner wall within, concentric to, and spaced from said outer wall, the inner wall having an interior chamber, and the space between said inner and outer walls forming an annular axially extending flow-through reactor chamber,
   the inner wall having a closed top end and having a bottom end opening through said bottom end cap;
   a rotation fixture within said reactor chamber and resting on a support bearing carried by said bottom end cap;
   a susceptor positionable on said rotation fixture for receiving material to be treated in said reactor chamber;
   a driver for rotating said rotation fixture around said inner wall and within said reactor chamber to carry said susceptor around said inner wall within said reactor chamber; and
   a heater within said inner wall for heating said material.

2. The reactor of claim 1, further including a lifter supported on said top end cap and engageable with said susceptor for positioning said susceptor in said reactor chamber on said rotation fixture and for removing said susceptor from said reactor chamber.

3. The reactor of claim 2, wherein said lifter is normally disengaged from said susceptor when said susceptor is positioned on said rotation fixture.

4. The reactor of claim 3, wherein said driver includes a ring gear on said rotation fixture engageable by a drive gear carried by a drive motor for selectively rotating said support.

5. The reactor of claim 4, wherein said lifter is a lift tube having an upper end including a lift bearing rotatably engaging said top end cap and having a lower end including an outwardly extending flange engageable with a corresponding shoulder on said susceptor, whereby removal of said top end cap causes said lift tube to lift said susceptor out of said reactor chamber.

6. The reactor of claim 5, wherein said inner and outer walls, said rotation fixture and said lift tube are quartz tubes.

7. The reactor of claim 1, further including:
   a plurality of inlet ports spaced circumferentially around the top end of said reactor chamber for introducing reactive gases at spaced locations; and
   a plurality of exit ports spaced circumferentially around the bottom end of said reactor chamber for removing said gases from said chamber, whereby said gases flow substantially axially through said chamber and rotation of said susceptor by said driver causes the susceptor to move sequentially through the axial flow of gas from each of said spaced inlet ports.

8. The reactor of claim 7, further including a gas cooler in the path of gases flowing through the reactor chamber.

9. The reactor of claim 8, further including filter means for filtering gases flowing through said reaction chamber.

10. The reactor of claim 7, wherein said exit ports are located at spaced locations around a circumference of said bottom end cap.

11. The reactor of claim 10, further including nonreactive filters for filtering gases flowing to each exit port.

12. The reactor of claim 7, further including hermetic seals between said top end cap and said outer wall, between said bottom end cap and said outer wall, and between said bottom end cap and said inner wall to provide a sealed reaction chamber.

13. The reactor of claim 12, further including a first dry box for said reactor, said inner wall opening through said bottom end cap allowing communication between the interior chamber of said inner wall and the interior of said dry box, whereby said dry box provides an ambient atmosphere for said interior chamber.

14. The reactor chamber of claim 12, wherein said top and bottom end caps are metal and said inner and outer walls are quartz tubes, and wherein said hermetic seals includes elastomeric o-rings secured against outer surfaces of said tubes by annular clamps secured to said top and bottom end caps.

15. The reactor chamber of claim 12, wherein said susceptor is annular, and includes an outer sloping reactor surface for positioning material to be treated in said axial flow of gas.

16. The reactor chamber of claim 15, further including individual reactive gas sources connectable through selected inlet ports to provide corresponding axial gas flow zones within said reactor chamber, said driver being operable to rotate said susceptor to pass said material sequentially through said gas flow zones.

17. The reactor chamber of claim 16, further including a controller for selectively regulating the flow of reactive gases to said inlet ports.

* * * * *